United States Patent [19]
Oki et al.

[11] Patent Number: 5,451,549
[45] Date of Patent: Sep. 19, 1995

[54] SEMICONDUCTOR DICING METHOD WHICH USES VARIABLE SAWING SPEEDS

[75] Inventors: Tetsuro Oki; Yoshio Murakami, both of Kyoto, Japan

[73] Assignee: Rohm Co., Ltd., Kyoto, Japan

[21] Appl. No.: 199,746

[22] Filed: Feb. 22, 1994

[30] Foreign Application Priority Data

Mar. 1, 1993 [JP] Japan .................................. 5-039742

[51] Int. Cl.⁶ .................... H01L 21/301; H01L 21/304
[52] U.S. Cl. ............................ 437/226; 148/DIG. 28
[58] Field of Search ............................ 437/226, 227; 148/DIG. 28

[56] References Cited

U.S. PATENT DOCUMENTS

| | | | |
|---|---|---|---|
| 4,304,641 | 12/1981 | Grandia et al. | 204/23 |
| 5,266,528 | 11/1993 | Yamada | 437/226 |
| 5,338,967 | 8/1994 | Kosaki | 257/620 |

*Primary Examiner*—R. Bruce Breneman
*Assistant Examiner*—Matthew Whipple
*Attorney, Agent, or Firm*—Oliff & Berridge

[57] ABSTRACT

A semiconductor dicing method capable of preventing the silver plating from refusing by heat generated during cutting at thick portions without reducing a large production amount. One end of a semiconductor wafer starts to be cut at a blade feeding speed of 16 mm/sec and the speed is gradually increased. The wafer is cut from a predetermined position to another predetermined position at the constant feeding speed of 40 mm/sec. The speed is then gradually decreased and another end of the semiconductor wafer finishes being cut at the feeding speed of 16 mm/sec. That is, at the cutting start, SPEED UP and at the cutting end, SLOW DOWN. Hence, the thick silver plating are slowly cut and the cutting part is cooled with cooling water. Thus, the heat generated by cutting friction can completely be controlled to prevent the silver plating from refusing.

21 Claims, 6 Drawing Sheets

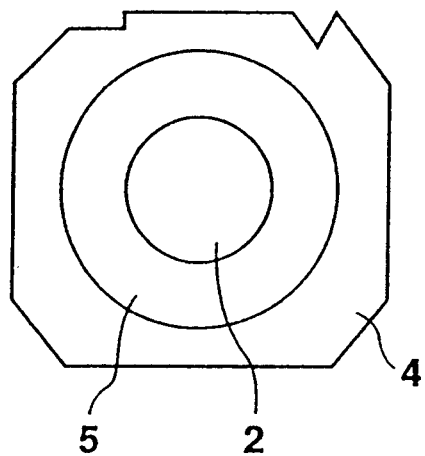
Fig. 6 (A)
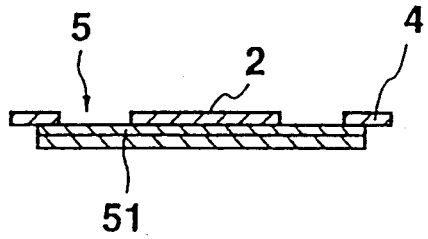
Fig. 6 (B)
|  | CONVENTIONAL CONDITION | SPEED UP SLOW DOWN CUT |
|---|---|---|
| CHIP APPEARANCE PERCENT DEFECTIVE (CHIPPING, CRACK OCCURRENCE RATE) | 0.65 % (0.1 %) | 0.065 % (0.06 %) |
| HALF CUT WAFER OCCURRENCE RATE | 9.0 % | 0.55 % |
Fig. 7

SEMICONDUCTOR DICING METHOD WHICH USES VARIABLE SAWING SPEEDS

BACKGROUND OF THE INVENTION i) Field of the Invention

The present invention relates to a dicing method of a semiconductor wafer for use in producing semiconductor devices such as a rectifier diode or the like, and more particularly to a semiconductor dicing method in which a semiconductor wafer having at least one surface plated with a metallic material abundant in malleability and ductility is cut by moving the wafer relative to a rotating blade.

ii) Description of the Related Arts

Conventionally, a semiconductor dicing method in which a semiconductor wafer having at least one surface plated with a metallic material abundant in malleability and ductility is cut by moving the wafer relative to a rotating blade. In this semiconductor dicing method, as shown in FIG. 1, a semiconductor wafer 2 plated with Ag (silver) is mounted on a PVC (polyvinyl chloride) tape 5 provided between frames 4 and a rotating blade 1 is moved relative to the semiconductor wafer 2 at a certain feeding speed to cut the semiconductor wafer 2 into pellets. For example, the cutting position of the semiconductor wafer 2 is shown in FIG. 2 and the semiconductor wafer 2 is cut at a central position of a groove etched on the semiconductor wafer 2. A glass layer 21 is provided over the groove. The glass layer 21 prevents surface leakage of P and N layers of the semiconductor wafer 2. The semiconductor wafer 2 plated with silver layers 22 and 23 is cooled down by cooling water immediately after the cutting. This cooling water is supplied at the rate of 1.4 liter/min.

An adhesive is coated on the upper surface of the PVC tape 5 to provide convenience for fixing on the desired position and preventing the scattering of the pellets after cutting. In this case, the revolving speed of the blade 1 while cutting is between $3 \times 10^4$ and $6 \times 10^4$ r.p.m. and the blade feeding speed is set constant in the range of 30 to 60 mm/sec.

Incidentally, in a plating method of the semiconductor wafer such as a jet plating method, a plating apparatus has a construction shown in FIG. 3 and the semiconductor wafer 2 is placed on a negative electrode in the upper position, as shown in FIG. 3. In this case, a plating liquid flow passes by the periphery of the semiconductor wafer 2 and thus, as shown in FIG. 4(a), a thickness of a silver plating 3 near the external peripheral portion of the semiconductor wafer 2 is 7 to 13 $\mu$m which is thicker than the thickness (6 $\mu$m) of the central portion.

Since the silver is abundant in malleability and ductility, in the thick portion of the silver plating, that is, the external peripheral portion, the silver once cut is fused again by the heat of the rotating cutter, and hence the semiconductor wafer 2 can not be separated into individual pellets. Further, in the glass layer 21, when cutting at the higher feeding speed of 30 to 60 mm/sec, an impact force given to the glass layer 21 is strong, and causes cracks or chipping in the glass layer 21. As a result, generally, the semiconductor wafer 2 can not be used as products or goods.

In order to solve the above problem, it is considered that the feeding speed of the blade 1 is reduced to at most 20 mm/sec and the semiconductor wafer is sufficiently cooled by the cooling water to suppress the heat generation. However, the reduction of the blade feeding speed brings about a sharp reduction in production amount.

SUMMARY OF THE INVENTION

It is therefore an object of the present invention to provide a semiconductor dicing method in view of the above-described problems of the prior art, which is capable of preventing the silver plating in a thick portion from refusing due to heat generated during cutting, while reducing or preventing the occurrence of cracks and chipping in a glass layer of the semiconductor wafer and preventing a reduction of the production amount.

In accordance with one aspect of the present invention, there is provided a semiconductor dicing method for cutting a semiconductor wafer having at least one surface plated with a metallic material abundant in malleability and ductility by moving a rotating blade relative to the semiconductor wafer, comprising a first step for starting the cutting of one end of the semiconductor wafer at a cutting start speed of at least a first predetermined relative moving speed; a second step for cutting the semiconductor wafer at a second predetermined relative moving speed after the first step, said second predetermined relative moving speed being higher than the first predetermined relative moving speed; and a third step for finishing cutting of another end of the semiconductor wafer at a cutting finish speed of at least a third predetermined relative moving speed after the second step, said third predetermined relative moving speed being lower than the second predetermined relative moving speed.

The semiconductor dicing method further includes a step for increasing a relative moving speed to the second predetermined relative moving speed after the first predetermined relative moving speed is reduced after the first step; and a step for increasing the relative moving speed to the third predetermined relative moving speed after the second predetermined relative moving speed is decreased to less than the third predetermined relative moving speed after the second step.

The first predetermined relative moving speed is decreased at a cutting finish portion of a thick metal part on a cutting start side of the semiconductor wafer, and the relative moving speed is increased to the third predetermined relative moving speed at a cutting start portion of the thick metal part on a cutting finish side of the semiconductor wafer.

The semiconductor dicing method further includes a step for gradually increasing a relative moving speed to the second predetermined relative moving speed after the first step, and a step for gradually decreasing the relative moving speed to less than the third predetermined relative moving speed after the second step.

Cutting is started at one end on the cutting start side of the semiconductor wafer while a relative moving speed is increased. Cutting is finished at another end on the cutting finish side of the semiconductor wafer while a relative moving speed is decreased.

The first predetermined relative moving speed is equal to the third predetermined relative moving speed.

According to the present invention, in the semiconductor dicing method, cutting is started at one end of the semiconductor wafer at the cutting start speed of at least the first predetermined relative moving speed by the rotating blade. Next, nearly the whole area of the semiconductor wafer is cut at the second predetermined relative moving speed by the rotating blade, and then cutting is finished at another end of the semiconductor wafer at the cutting finish speed of at least the third predetermined relative moving speed by the rotating blade.

Hence, the thick portions of the silver plating are cut slowly and thus heat generation can be suppressed to prevent a refusing of silver plating. Also, since cutting is started at one end of the semiconductor wafer at the cutting start speed of at least the first predetermined relative moving speed by the rotating blade, an impact against a glass layer by the rotating blade is small to reduce or prevent an occurrence of cracks and chipping in the glass layer. Further, the thin portions of the silver plating can be cut quickly and thus the production amount will not be reduced.

BRIEF DESCRIPTION OF THE DRAWINGS

The objects, features and advantages of the present invention will become more apparent from the consideration of the following detailed description, taken in conjunction with the accompanying drawings, in which:

FIG. 6(A) is a top view of a frame of the semiconductor dicing apparatus and FIG. 6(B) is a longitudinal cross section thereof;

FIG. 7 shows a listing of a chip appearance percent defective and a half cut wafer occurrence rate in the method of the invention in comparison with a conventional method.

DESCRIPTION OF THE PREFERRED EMBODIMENTS

Figure 1:
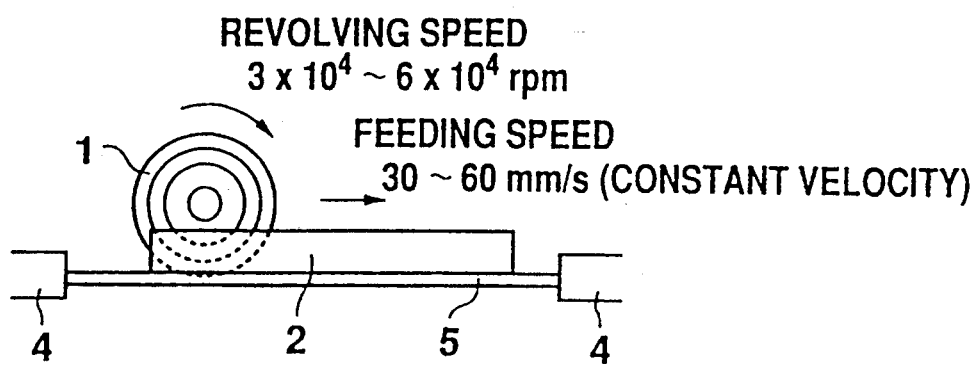
FIG. 1 is a schematic elevational view showing a construction of a conventional semiconductor dicing apparatus.

The present invention will now be described in connection with its preferred embodiments with reference to the accompanying drawings, wherein like reference characters designate like or corresponding parts throughout the views and thus the repeated description thereof can be omitted for brevity.

Figure 5:
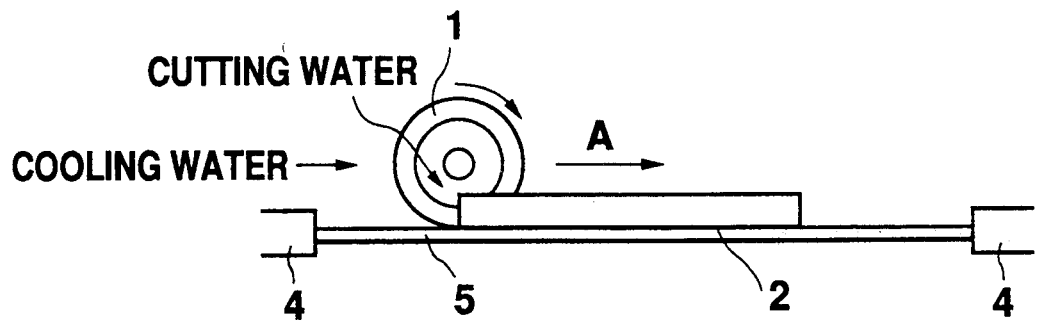
FIG. 5(A) is a schematic elevational view of a semiconductor dicing apparatus used for a semiconductor dicing method according to the present invention and FIG. 5(B) is a graphical representation showing a blade feeding speed variation in relation with a wafer position in the method according to one embodiment of the present invention.
Figure 5:
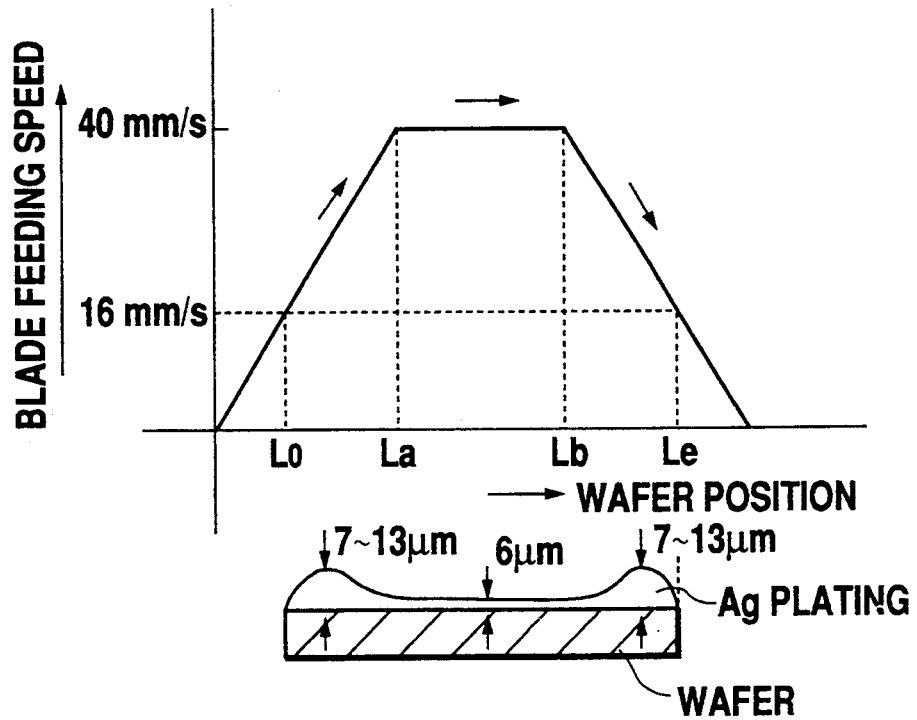

In FIG. 5(A), there is shown a semiconductor dicing apparatus to which a semiconductor dicing method according to the present invention is applied.

As shown in FIG. 5(A), the semiconductor dicing apparatus includes a blade 1 which is rotated at $6 \times 10^4$ r.p.m. and is moved at a certain feeding speed in a direction shown by an arrow A and the blade 1 cuts a semiconductor wafer 2 at a predetermined cutting position. In this case, in order to prevent a product and the blade 1 from being broken by the heat generated by cutting, to remove chips and the like in cutting, and to prevent loading of the blade 1, cooling water is directly supplied to a cutting part at the rate of 1.6 liter/min. The supply of the cooling water also serves to remove chips in cutting so as to prevent the loading of the blade 1. In order to quickly cool the hot blade 1 during cutting, cooling water is supplied at the rate of 1.4 liter/min. Also, as shown in FIGS. 6(A) and 6(B), the semiconductor wafer 2 is settled on a PVC tape 5 mounted to a frame 4. To the PVC tape 5, an adhesive layer 51 is coated so as to fix to a predetermined position of the semiconductor wafer 2 and to prevent the scattering of the pellets after the cutting.

In this embodiment, as to the feeding speed of the blade 1, as shown in FIG. 5(B), the cutting is started at a moving speed of 16 mm/sec at one end $L_o$ of the semiconductor wafer 2. The feeding speed is gradually increased, while the blade 1 cuts the semiconductor wafer 2 from Lo to a predetermined position La. Then, the semiconductor wafer 2 is cut from the predetermined position La to another predetermined position Lb at the speed of 40 mm/sec. The speed is then gradually decreased while cutting the semiconductor wafer 2 from the position Lb to the other end Le of the semiconductor wafer 2 at the speed of 16 mm/sec.

Figure 2:
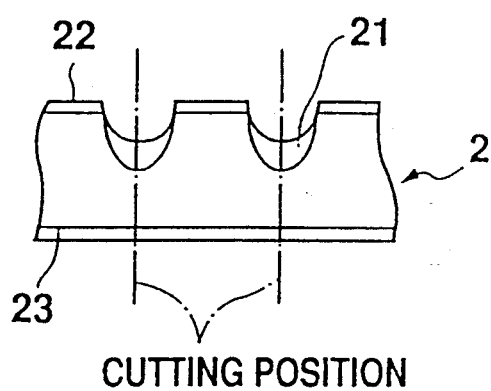
FIG. 2 is a fragmentary side view of a semiconductor wafer for showing cutting positions by the apparatus shown in FIG. 1.
Figure 3:
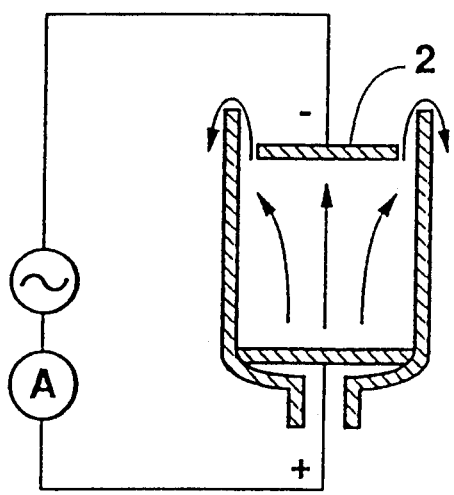
FIG. 3 is a schematic view of a conventional jet plating apparatus.

That is, at the cutting start portion, the feeding speed is gradually increased and at the cutting end portion, the feeding speed is gradually decreased. Hence, at the thick plating parts of the silver plating, the cutting is carried out at a low speed to control the heat generation and in addition since the cooling is carried out by the cooling water, the silver plating part does not refuse. Thus, an occurrence of inferior goods can be largely reduced. Also, in the case of cutting the glass layer 21 shown in FIG. 2, at the cutting start point, the blade 1 hits on the glass layer 21 at a slow speed and the cutting speed is gradually increased. Therefore, the impact force against the glass layer 21 is small to reduce or prevent an occurrence of cracks or chipping in the glass layer 21. Also, at the end portion on the cutting finish side, while the speed is gradually decreased, the cutting is executed and the impact to the end portion can be diminished. Also, in the intermediate area of the semiconductor wafer 2 except the thick plating parts, the cutting is performed at a high moving speed and hence the production amount will not be noticeably reduced.

In this case, by experiment, as shown in FIG. 7, it is confirmed that in comparison in which a conventional method with the percent defective in chip appearance reaches 0.65%, in this embodiment it is largely reduced to 0.065% and a half cut occurrence due to refusing of the silver plating parts is largely reduced to approximately 0.55% compared with approximately 9.0% in the conventional method.

Further, how to change the feeding speed with the passage of time is not restricted to the above-described case. For example, another method can be considered. That is, the cutting is started from a constant feeding speed 10 mm/sec and, when the blade advances a distance of approximately 5 mm to 10 mm, the speed is rapidly increased to 40 mm/sec to carry out the cutting at this constant high speed. Then, when the blade reaches approximately 10 mm from the end of the semiconductor wafer, the speed is rapidly decreased to 10 mm/sec to execute the cutting at this constant speed to the end.

Figure 8:
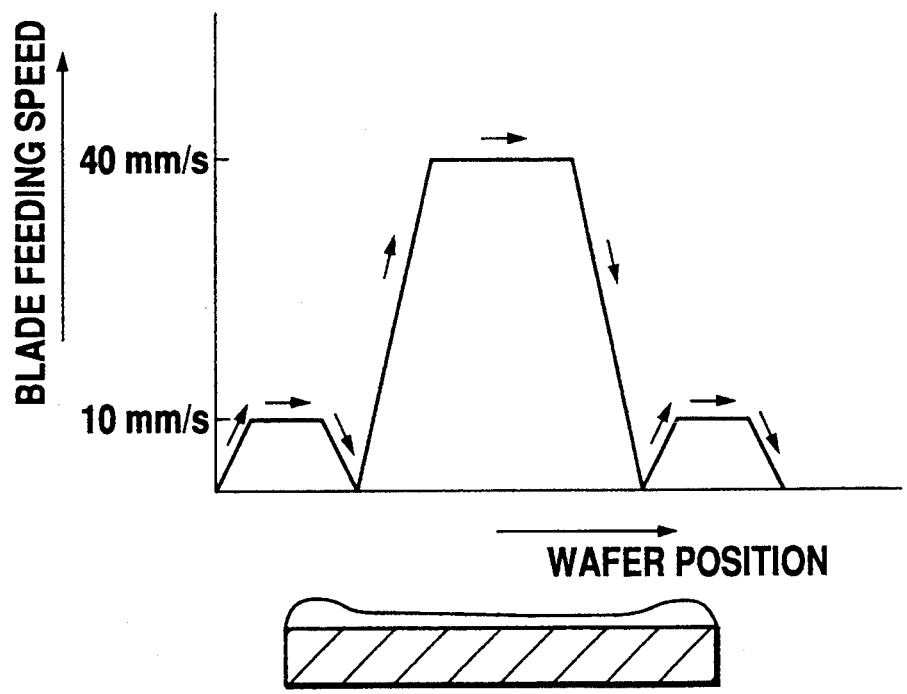
FIG. 8 shows a graphical representation of a blade feeding speed variation in relation with a wafer position in other embodiments of a semiconductor dicing method according to the present invention.

Also, as shown in FIG. 8, the cutting of the semiconductor wafer is started from the feeding speed 10 mm/sec and the speed is temporarily decreased to 0 mm/sec near the end of the thick metal part. Next, the speed is increased up to 40 mm/sec to continue the cutting at this constant high speed. Then, the speed is temporarily decreased to 0 mm/sec and the speed is gradually increased again up to 10 mm/sec near the cutting start of the thick metal part to continue the cutting at this speed of 10 mm/sec to the end. In this method, at the portion near the cutting finish of the thick metal part on the cutting start side and the portion near the cutting start of the thick metal part on the cutting finish side of the semiconductor wafer, that is, at a part B and a part C shown in FIG. 4(B), the impact can be moderated to prevent glass crack and half cut.

Figure 4:
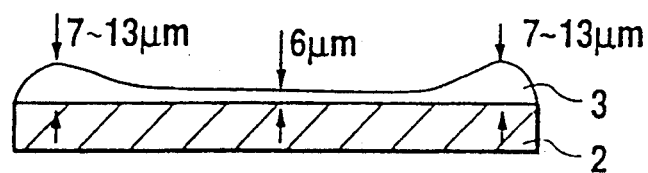
FIG. 4(A) is a cross sectional view of a semiconductor wafer plated with a metallic material in a conventional method and FIG. 4(B) is a cross sectional view of a semiconductor wafer plated with a metallic material.
Figure 4:
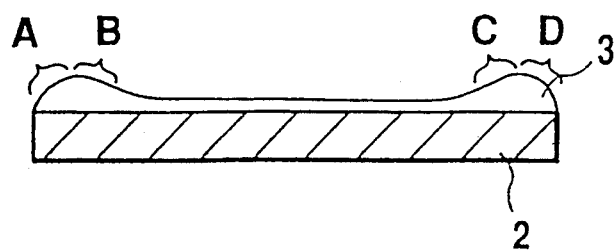
Figure 9:
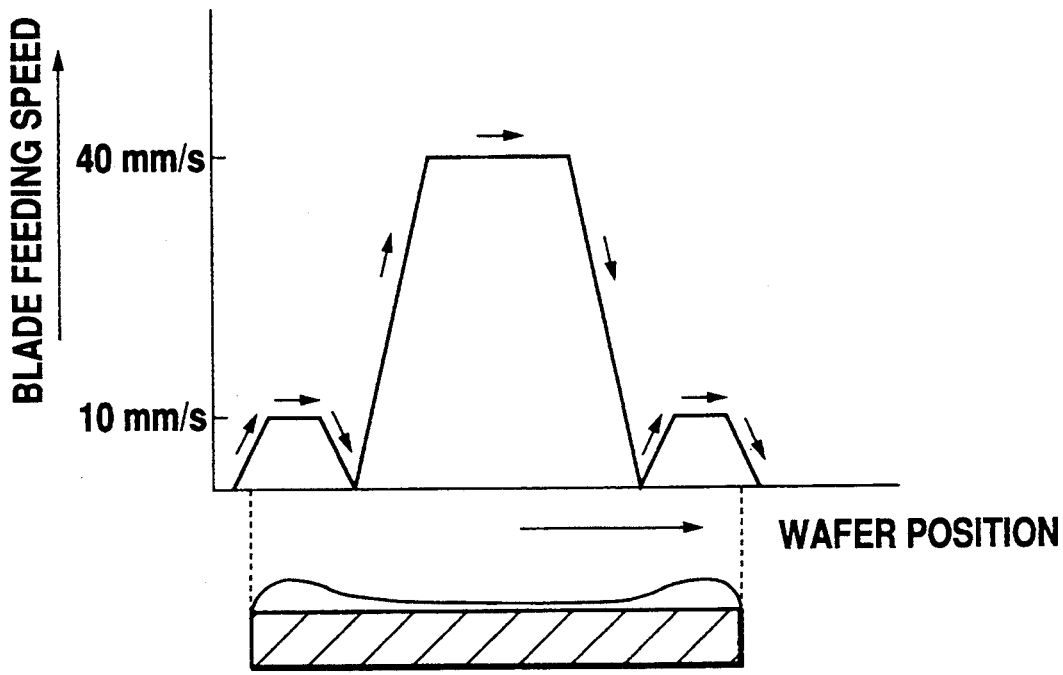
FIG. 9 shows a graphical representation of a blade feeding speed change variation in relation with a wafer position in further embodiments of a semiconductor dicing method according to the present invention.

Although the cutting start and finish of the ends of the semiconductor wafer are carried out at the constant speed 10 mm/sec in the above-described method, a further method is considered, as shown in FIG. 9. That is, as the feeding speed is gradually increased from 0 mm/sec to 10 mm/sec, the cutting of the end portion of the semiconductor wafer is started and after the cutting is continued at the constant speed 10 mm/sec, the speed is temporarily decreased to 0 mm/sec near the end of the thick metal part. Thereafter, the speed is increased to 40 mm/sec to continue the cutting at this constant high speed and then the speed is decreased to 0 mm/sec. Again, the speed is increased to 10 mm/sec at the start of the thick metal part to continue the cutting at this speed 10 mm/sec and as the speed is gradually decreased from 10 mm/sec to 0 mm/sec, the other end of the semiconductor wafer is cut to finish the cutting. In this method, at the cutting start portion of the thick metal part on the cutting start side, the relative speed is gradually increased and at the cutting finish portion of the metal thick part on the cutting finish side, the relative speed is also gradually decreased. Hence, as shown in FIG. 4(B), in not only the parts B and C but also parts A and D, the impact can be lightened.

Figure 10:
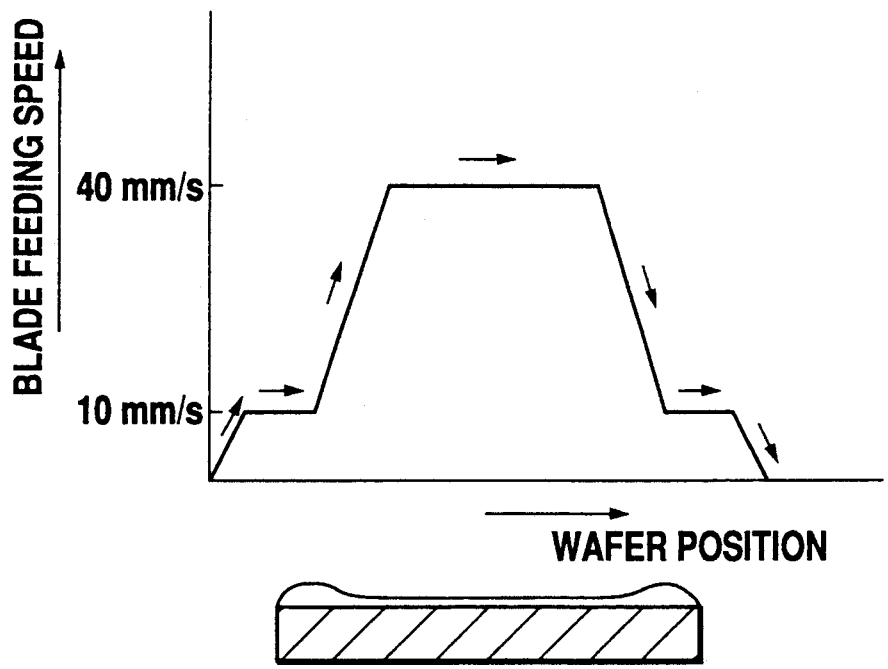
FIG. 10 shows a graphical representation of a blade feeding speed variation in relation with a wafer position in further embodiments of a semiconductor dicing method according to the present invention.
Figure 11:
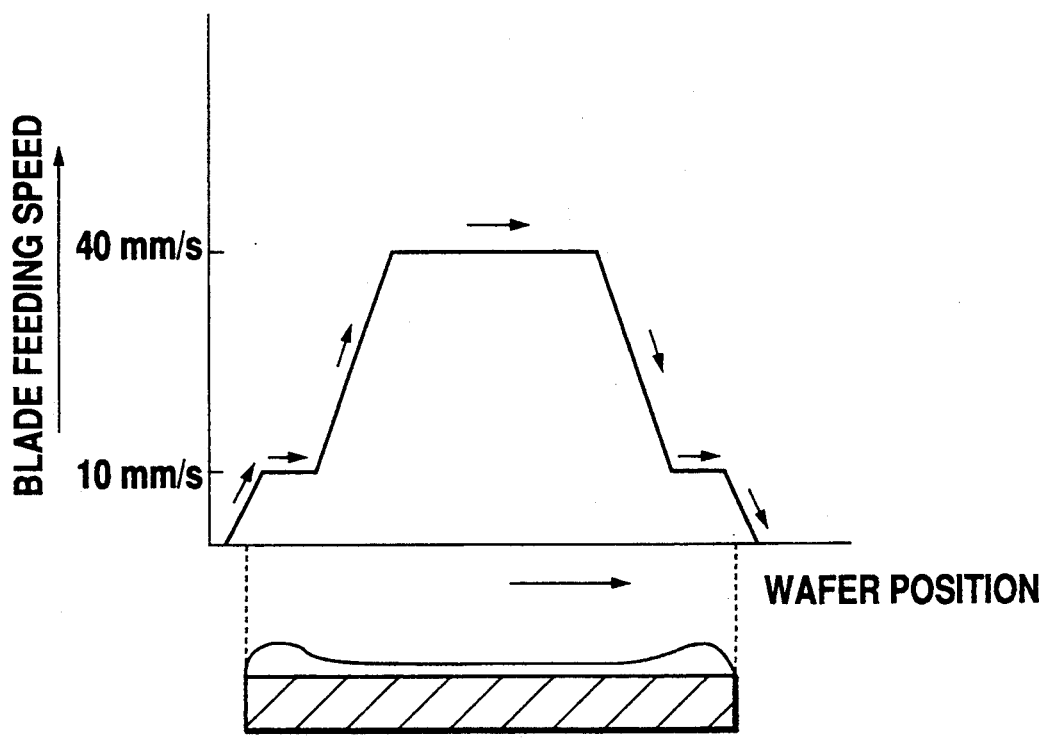
FIG. 11 shows a graphical representation of a blade feeding speed variation in relation with a wafer position in further embodiments of a semiconductor dicing method according to the present invention.

Further, as shown in FIG. 10, still another cutting method is considered. That is, the thick part of the plating is cut at a constant feeding speed (10 mm/sec) so as not to cause the half cut and after cutting the thick part of the plating at this speed, the speed is gradually increased to 40 mm/sec to cut the thin part of the plating at this constant high speed. Then, before the end of the thin part of the plating, the speed is gradually decreased from 40 mm/sec to 10 mm/sec to cut the thick part of the plating at 10 mm/sec again. In this method, the feeding speed is gradually increased and also gradually decreased and thus the impact against the semiconductor wafer can be reduced. Also, as shown in FIG. 11, another method is considered. That is, further, at the cutting start of the semiconductor wafer, the feeding speed is also gradually increased and at the finish of the semiconductor wafer, the speed is also gradually decreased. As a result, the impact at the end portions of the semiconductor wafer can be reduced.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor dicing method for cutting a semiconductor wafer with at least one surface plated with a highly malleable and ductile metallic material by feeding the semiconductor wafer toward a rotating blade, said metallic material forming swells on opposite peripheral portions of the at least one surface during plating, said method comprising the steps of:

feeding the semiconductor wafer at one of the opposite peripheral portions toward the rotating blade at a first feeding speed; thereafter feeding the semiconductor wafer at a portion between the swells toward the rotating blade at a second feeding speed, said second feeding speed being set higher than the first feeding speed so that the swell is prevented from refusing after being cut; and thereafter feeding the semiconductor at the other one of the opposite peripheral portions toward the rotating blade at the first feeding speed.

2. The method of claim 1, further comprising the steps of:

decreasing a feeding speed from the first feeding speed after feeding one of the opposite peripheral portions of the semiconductor wafer toward the rotating blade; then increasing the feeding speed to the second feeding speed;

decreasing the feeding speed to less than the first feeding speed after feeding the semiconductor wafer a portion between the swells toward the rotating blade; and then increasing the feeding speed to the first feeding speed.

3. The method of claim 2, wherein the feeding speed is decreased from the first feeding speed before the rotating blade reaches a downstream end of the swell at one of the opposite peripheral portions of the semiconductor wafer and the feeding speed is increased to the first feeding speed before the rotating blade reaches an upstream end of the swell at the other one of the opposite peripheral portions of the semiconductor wafer.

4. The method of claim 1, further comprising the steps of:

after feeding a portion of the swell at one of the opposite peripheral portions, gradually increasing a feeding speed from the first feeding speed to the second feeding speed, and after feeding a portion of the semiconductor wafer between the swells, gradually decreasing the feeding speed from the second feeding speed to the first feeding speed.

5. The method of claim 1, wherein the feeding speed is gradually increased to the first feeding speed while the rotating blade reaches an upstream end of the swell at one of the opposite peripheral portions.

6. The method of claim 2, wherein the feeding speed is gradually increased to the first feeding speed while the rotating blade reaches an upstream end of the swell at one of the opposite peripheral portions.

7. The method of claim 3, wherein the feeding speed is gradually increased to the first feeding speed while the rotating blade reaches an upstream end of the swell at one of the opposite peripheral portions.

8. The method of claim 4, wherein the feeding speed is gradually increased to the first feeding speed while the rotating blade reaches an upstream end of the swell at one of the opposite peripheral portions.

9. The method of claim 1 wherein the feeding speed is qradually decreased from the first feeding speed while the rotating blade reaches a downstream end of the swell at the other one of the opposite peripheral portions.

10. The method of claim 2, wherein the feeding speed is gradually decreased from the first feeding speed while the rotating blade reaches a downstream end of the swell at the other one of the opposite peripheral portions.

11. The method of claim 3, wherein the feeding speed is gradually decreased from the first feeding speed while the rotating blade reaches a downstream end of the swell at the other one of the opposite peripheral portions.

12. The method of claim 4, wherein the feeding speed is gradually decreased from the first feeding speed while the rotating blade reaches a downstream end of the swell at the other one of the opposite peripheral portions.

13. The method of claim 5, wherein the feeding speed is gradually decreased from the first feeding speed while the rotating blade reaches a downstream end of the swell at the other one of the opposite peripheral portions.

14. The method of claim 6, wherein the feeding speed is gradually decreased from the first feeding speed while the rotating blade reaches a downstream end of the swell at the other one of the opposite peripheral portions.

15. The method of claim 7, wherein the feeding speed is gradually decreased from the first feeding speed while the rotating blade reaches a downstream end of the swell at the other one of the opposite peripheral portions.

16. The method of claim 8, wherein the feeding speed is gradually decreased from the first feeding speed while the rotating blade reaches a downstream end of the swell at the other one of the opposite peripheral portions.

17. A semiconductor dicing method for cutting a semiconductor wafer with at least one surface plated with a highly malleable and ductile metallic material by feeding the semiconductor wafer toward a rotating blade, said metallic material forming a swell on a peripheral portion of the at least one surface during plating, said method comprising the steps of:

feeding the semiconductor wafer at the peripheral portion having the swell toward the rotating blade at a first feeding speed; and thereafter feeding the semiconductor wafer toward the rotating blade at a second feeding speed, said second feeding speed being set higher than the first feeding speed so that the swell of the highly malleable and ductile metallic material is prevented from refusing after being cut.

18. A semiconductor dicing method of claim 17, further comprising the steps of:

decreasing a feeding speed from the first feeding speed before the rotating blade reaches a downstream end of the swell; thereafter gradually increasing the feeding speed to the second feeding speed.

19. A semiconductor dicing method of claim 17, wherein the feeding speed is gradually increased to the first feeding speed while the rotating blade reaches an upstream end of the swell.

20. A semiconductor dicing method of claim 17, wherein the feeding speed is gradually decreased from the first feeding speed while the rotating blade reaches a downstream end of the swell.

21. A semiconductor dicing method of claim 19, wherein the feeding speed is gradually decreased from the first feeding speed while the rotating blade reaches a downstream end of the swell.

* * * * *